United States Patent
Van Haren et al.

(10) Patent No.: US 8,252,491 B2
(45) Date of Patent: Aug. 28, 2012

(54) METHOD OF FORMING A MARKER, SUBSTRATE HAVING A MARKER AND DEVICE MANUFACTURING METHOD

(75) Inventors: Richard Johannes Franciscus Van Haren, Waalre (NL); Maurits Van Der Schaar, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 360 days.

(21) Appl. No.: 12/619,813

(22) Filed: Nov. 17, 2009

(65) Prior Publication Data

US 2010/0140816 A1 Jun. 10, 2010

Related U.S. Application Data

(60) Provisional application No. 61/121,033, filed on Dec. 9, 2008.

(51) Int. Cl.
*G03F 9/00* (2006.01)
*G03C 5/00* (2006.01)

(52) U.S. Cl. .......... 430/22; 430/312; 430/313; 430/314; 430/315; 430/394

(58) Field of Classification Search .................... 430/22, 430/312, 313, 314, 315, 394
See application file for complete search history.

(56) References Cited

U.S. PATENT DOCUMENTS 7,440,105 B2 * 10/2008 Adel et al. .................... 356/401

* cited by examiner

*Primary Examiner* — Christopher Young
(74) *Attorney, Agent, or Firm* — Pillsbury Winthrop Shaw Pittman LLP

(57) ABSTRACT

A marker, for example an alignment marker or an overlay marker is formed in two steps. First, a pattern of two chemically distinct feature types having a pitch comparable to product features is formed. This pattern is then masked by resist in the form of the desired marker, which has a larger pitch than the pattern. Finally, one of the two feature types is selectively etched in the open areas. The result is a marker with a large pitch suitable to be read with long wavelength radiation but the edges of the features are defined in an exposure step having a pitch comparable to the product features.

14 Claims, 6 Drawing Sheets

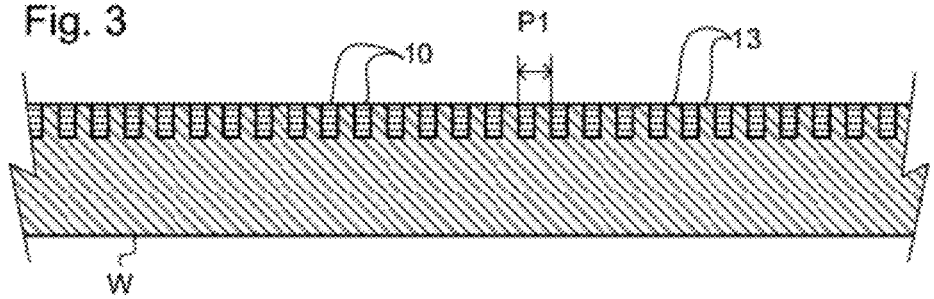
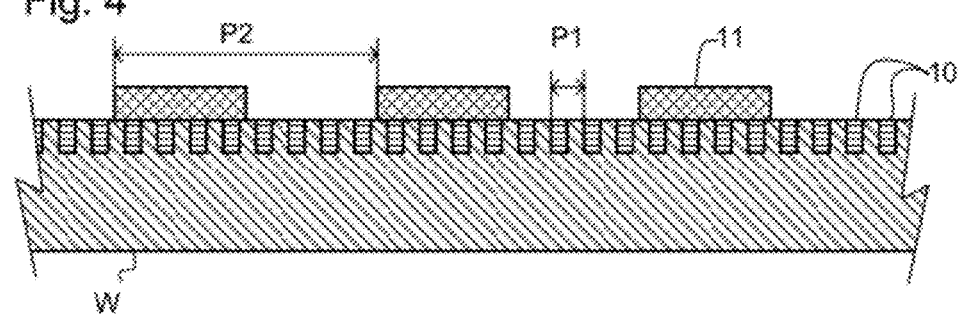
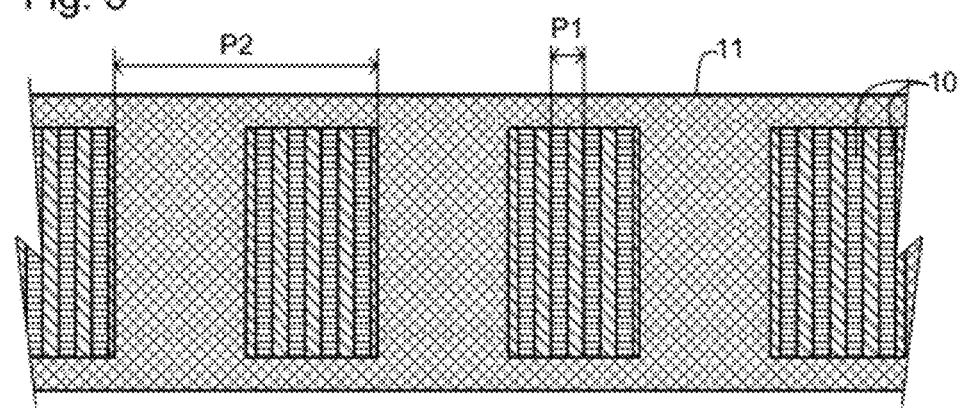
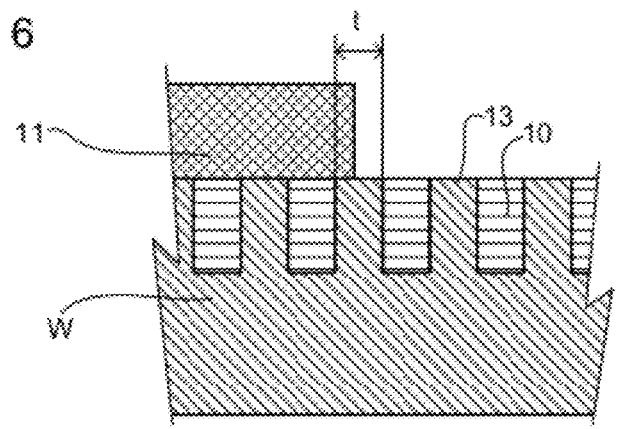

METHOD OF FORMING A MARKER, SUBSTRATE HAVING A MARKER AND DEVICE MANUFACTURING METHOD

CROSS-REFERENCE TO RELATED APPLICATION

This application claims priority and benefit under 35 U.S.C. §119(e) to U.S. Provisional Patent Application No. 61/121,033, entitled "Method Of Forming A Marker, Substrate Having A Marker and Device Manufacturing Method," filed on Dec. 9, 2008. The content of that application is incorporated herein in its entirety by reference.

FIELD

The present invention relates to a method for forming a marker using a lithographic apparatus and a substrate having the marker.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

To manufacture devices using lithographic techniques, it is necessary to form a number of patterned layers in accurate relative positions. To this end, it is common to form a plurality of markers on the substrate at the same time as the patterns required to form the desired devices. There are two main types of such markers: alignment markers and overlay markers. Alignment markers are usually formed in a single exposure step or process layer and are designed so that their position can be accurately measured with a suitable sensor device. They are used to define a reference position for printing one or more subsequent layers. Overlay markers have two components that are formed in different layers. The overlay marker is designed so that any difference in the position of the two layers, commonly referred to as an overlay error or simply overlay, is easily measurable. It is often not possible to accurately measure the exact position of an overlay marker.

SUMMARY

It is desirable to provide improved forms of marker, in particular alignment and overlay markers, and methods of forming those markers on substrates.

According to an aspect of the invention, there is provided a method of forming a marker on a substrate, the method comprising:

a first exposure step to define a first pattern in an area of the substrate, the first pattern having a pitch P1;

a transfer step to transfer the first pattern into the substrate to form an array of alternating first and second features having a pitch P1;

a second exposure step to define a second pattern comprising third features over the array of alternating first and second features, the second pattern having a pitch P2, wherein P2 is greater than P1; and a selective chemical process step to alter one of the first and second features exposed by open areas of the second pattern in preference to the other of the first and second features.

According to an aspect of the invention, there is provided A substrate having a marker thereon, the marker having a pitch P2 defined by first and second regions each having therein an array of alternating first and second features, the first and second features having a pitch P1; wherein in the first region the first and second features define a substantially flat upper surface; and in the second region the second features are at least partially reduced in height so that the upper surface of the second region is not flat.

According to an aspect of the invention, there is provided A device manufacturing method comprising:

forming a marker on a substrate, by:

a first exposure step to define a first pattern in an area of the substrate, the first pattern having a pitch P1;

a transfer step to transfer the first pattern into the substrate to form an array of alternating first and second features having a pitch P1;

a second exposure step to define a second pattern comprising third features over the array of alternating first and second features, the second pattern having a pitch P2, wherein P2 is greater than P1; and a selective chemical process step to alter one of the first and second features exposed by open areas of the second pattern in preference to the other of the first and second features; and measuring a property of the marker.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 depicts in cross-section a substrate in the course the method of FIG. 2;

FIG. 4 depicts in cross-section the substrate of FIG. 3 at a later stage in the method of FIG. 2;

FIG. 5 depicts in plan the substrate of FIG. 4;

FIG. 6 is an enlarged view of part of the substrate of FIG. 4;

DETAILED DESCRIPTION

Figure 1:
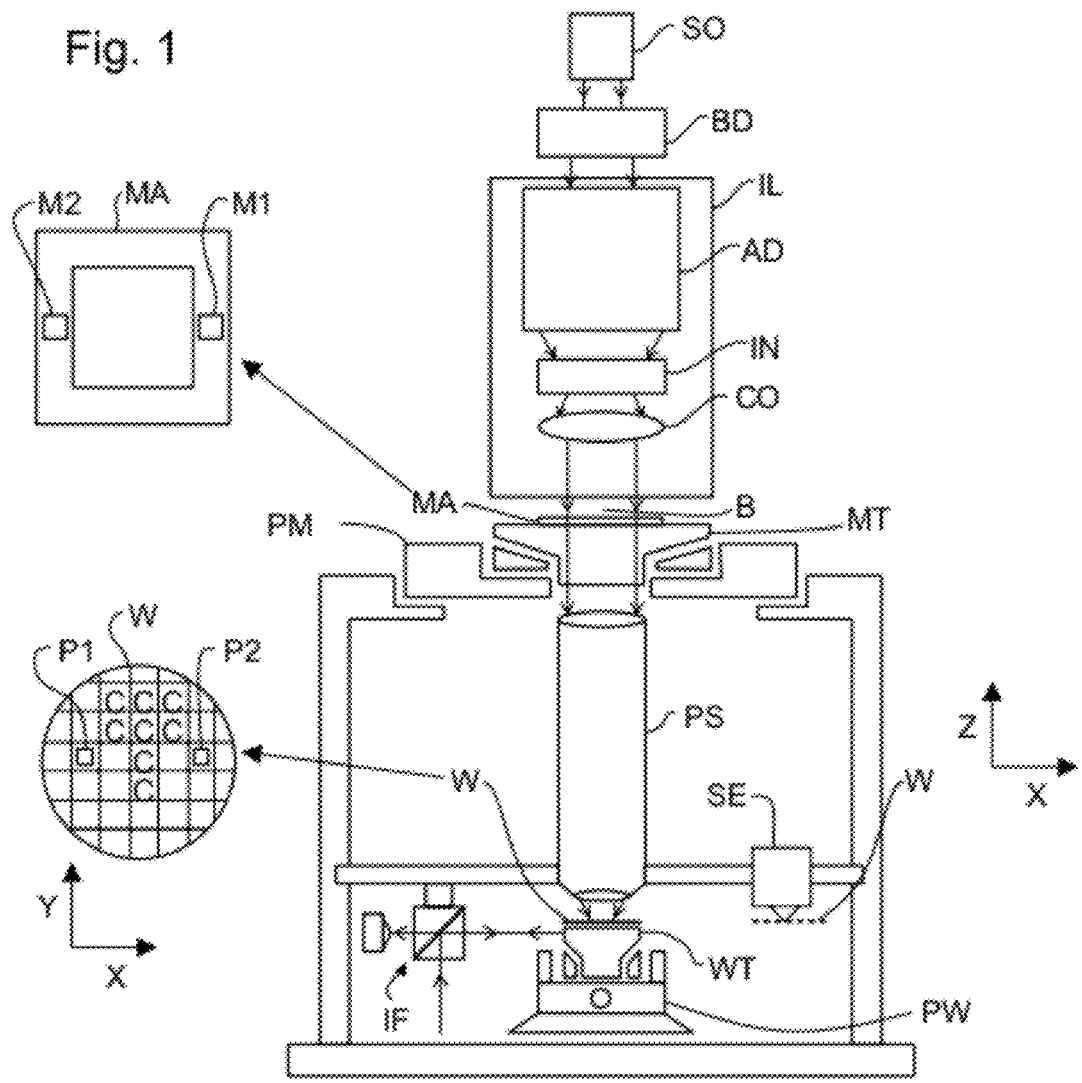
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In order to control the position of exposures used to build up the different layers that form a complex device, various markers are printed on the substrate when the device, or product, patterns are printed. Two important forms of such markers are alignment markers and overlay markers. An alignment marker is designed so that its position can be accurately measured with a particular sensor device and is used to define a reference position for printing a subsequent layer. An overlay marker has two components that are printed in different layers. It is designed to enable any positional offset, referred to as overlay error or simply overlay, between the two layers containing the components of the overlay marker to be measured using a particular sensor. Various different types of alignment sensor and overlay sensor are known. Alignment and overlay markers may be optimized for the particular sensor to be used. For example, one form of alignment mark incorporates multiple gratings of different alignments and different pitch. Such an alignment marker may detected by imaging different diffraction orders of light diffracted by the gratings onto reference gratings behind which sensors are located. An overlay marker may be imaged using a scanning electron microscope to determine overlay. A scatterometer may be used with both alignment and overlay markers. An alignment marker may be modified to increase its sensitivity to a particular imaging parameter, e.g. focus or dose, to enable measurement of such a parameter using an alignment sensor. Such markers are commonly formed in the so-called scribe lane, outside the area normally used for product features, but may also be formed in amongst the product features.

Alignment and overlay markers suffer from various limitations. In particular, most alignment and overlay sensors use radiation for detection that has a longer wavelength, e.g. 532 nm, than the wavelength, e.g. 193 nm, of the radiation used for exposure of product features. The pitches and sizes of the markers should be comparable to the wavelength of the detection radiation, in order for the markers to be detectable, whereas the pitches of the product features are comparable to or less than the wavelength of the exposure radiation. This difference in size and/or pitch means that the sensitivity of the markers to exposure and process parameters can be different to the sensitivity of the product features. For example, aberrations in a projection system may mean that the markers are printed at different displacements from their nominal positions than are the product features. Also, some process steps, such as chemical-mechanical polishing (CMP) and etching, affect large pitches differently than small pitches. Thus measurements made on markers may not accurately reflect the conditions of product pitches.

An aim of the invention is to provide a marker and a method of forming a marker, such that the sensitivity of the position of an edge of a feature of the marker to a process parameter is more similar to the sensitivity of a product feature. In an embodiment of the invention, an array of features having a pitch similar to the pitch of product features is used as a mold to create a marker having features of larger scale and/or pitch.

Figure 2:
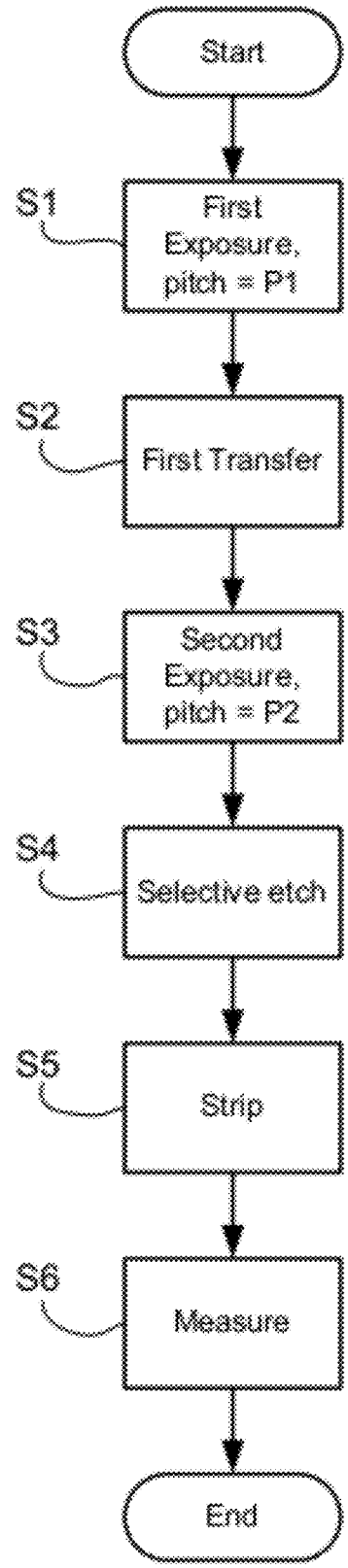
FIG. 2 is a flow diagram of a method of forming a marker according to an embodiment of the invention.

A method for forming an alignment marker according to an embodiment of the invention is depicted in FIG. 2, which is a flow diagram showing particular steps of the method. Each of the steps depicted in FIG. 2 may involve a number of sub-steps, in some cases a large number, that are each conventional; further description thereof will therefore be omitted. A substrate on which the method of FIG. 2 is performed is depicted, at various stages of the method, in FIGS. 3 to 9.

In the first step S1 of the method of FIG. 2, a first pattern having a pitch, P1, and/or critical dimension, the same as or similar to the pitch and/or critical dimension of product features is exposed in the area where the marker is to be formed. In an embodiment, this first exposure is carried out at the same time as exposure of product features by provision of appropriate additional patterns on the mask used for exposure of the product features. The pitch P1 is, in an embodiment, less than or equal to 150% of, more particularly less than or equal to 125% of, and most particularly substantially equal to, the smallest pitch included in the product features exposed at the same time. Next, in step S2, the first pattern is transferred into the substrate to form an array of features 10 having pitch P1 in the substrate W as shown in FIG. 3. Features 10 are chemically distinct from the background 13. Features 10 may, for example, be regions of silicon dioxide ($SiO_2$) formed by selective oxidation of a silicon substrate, or a polysilicon layer overlying the substrate W. Other examples of possible types of feature 10 are: polysilicon plugs in an $SiO_2$ layer (or another low-k material); tungsten (W) plugs in $SiO_2$; ion-implanted regions; selectively etched regions; or selectively grown regions. The features 10 may also be formed by atomic layer deposition. Features 10 should be formed of a material that is selectively etchable with respect to the background regions 13. It will become apparent that the features 10 may be omitted in regions that will be covered in the second pattern in the subsequent steps, but it may be useful to create a complete array of features 10 to avoid edge effects. Features 10 may take the form of lines, trenches, contact holes, SRAM cells or any other repetitive feature.

After formation of the first pattern of features 10, a layer of resist is deposited on the substrate W and exposed S3 to a second pattern having a pitch P2. If the developed resist is not etched by the etchant to be used in the subsequent etching step, it may be used directly, otherwise it can be used to pattern a hardmask layer over the first pattern. The developed resist or patterned hardmask is depicted in FIGS. 4 to 6. FIGS. 4 and 5 show the substrate at this stage in cross-section and plan respectively, FIG. 6 is an enlarged view of part of FIG. 4. The second pattern in resist or hardmask 11 defines the top-level structure of the marker to be formed and therefore pitch P2 is much greater than pitch P1. This ensures diffraction by the longer wavelength radiation of the measurement beam to be used. As will be explained below, the exact positions of the edges of the pattern in resist or hardmask 11 are not crucial, provided they are with a tolerance t indicated in FIG. 6. This tolerance is effectively the width of the background regions 13 between features 10. Pitch P2, the width of features 11 and their placement are chosen so that all the edges of features 11 lie on one of the background features 13. In an embodiment, pitch P2 is an integer multiple of pitch P1. In an embodiment P2 is greater than or equal to 4 timers P1. Therefore, the second exposure step S3 may be carried out with a lower accuracy, for example on a lower specification apparatus than the first exposure S1. In an embodiment the second exposure S3 is combined with a "mark open", "key open" or "mark repair" exposure step. It is also possible to carry out the two exposure or pattern-forming steps using different techniques. For example the first patterning step could be carried out by imprint lithography or e-beam lithography and the second by optical lithography.

Figure 7:
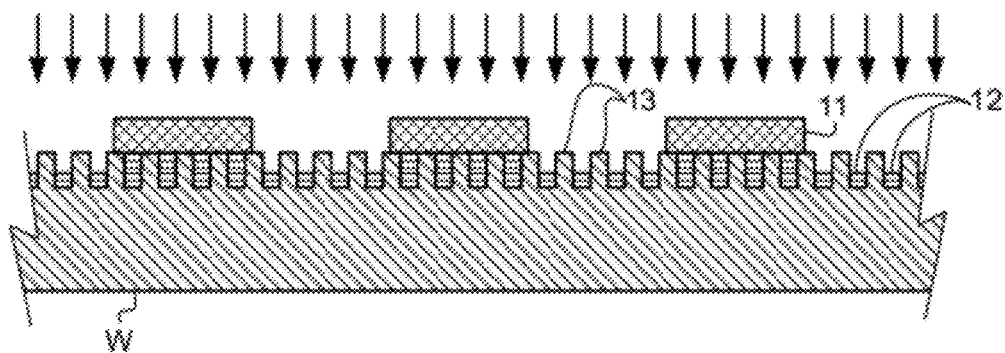
FIG. 7 depicts in cross-section the substrate of FIG. 4 at a later stage in the method of FIG. 2.
Figure 8:
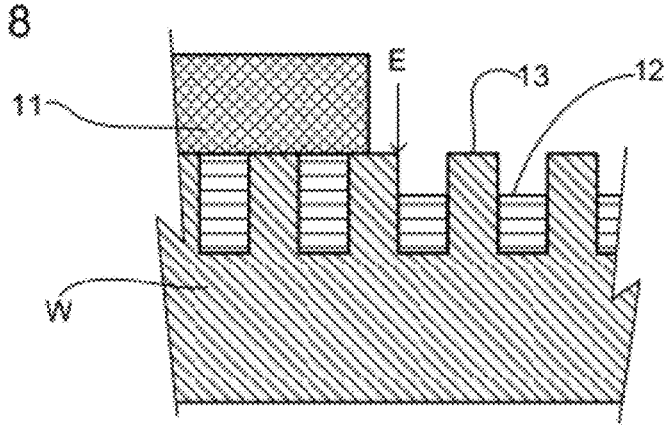
FIG. 8 is an enlarged view of a part of the substrate of FIG. 7.

The next step in the method of FIG. 2, is a selective etch of the features 10 that are not covered by the second pattern 11. This is shown in FIGS. 7 and 8, the latter being an enlargement of part of the former. The etchant is chosen so that the features 10 are etched in preference to the substrate background. The etchant may be isotropic or anisotropic. As can be seen in FIGS. 7 and 8, the etch results in formation of recessed features 12 in the open areas of the second pattern formed in resist or hardmask 11. Features 10 can be etched completely away in the open areas or the etch may be stopped before that occurs. It is only necessary that a detectable height difference between the etched and un-etched features be created. However, as can be seen in FIG. 8, by virtue of the selectivity of the etchant, the edge E of the effective marker feature is defined not by the second pattern, but by the first pattern formed in the first exposure. The purpose of the etch is to create a difference between the open regions and the regions covered by the second pattern that can be detected by the sensor. Instead of an etch, a chemical process that is selective towards either the features 10 or the background and changes the refractive index or extinction coefficient of one type of feature may be used. Another possibility is to use a selective deposition whereby additional material is preferentially deposited (grown) on one type of feature.

Figure 9:
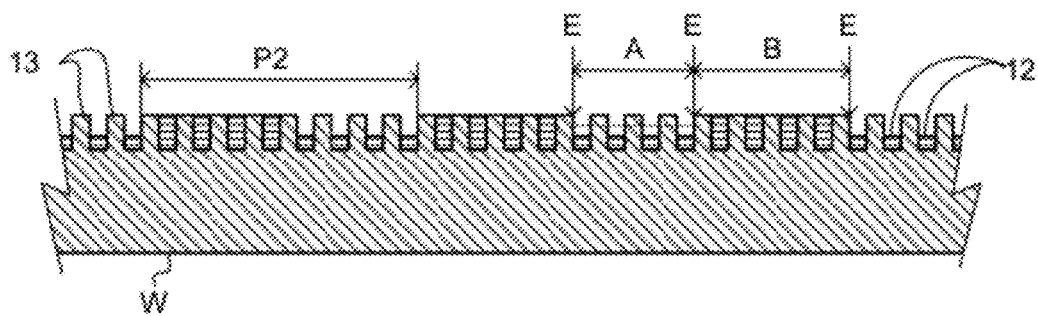
FIG. 9 depicts in cross-section a the substrate of FIG. 7 at a later stage in the method of FIG. 2.

After removal of the resist or hardmask 11 by a stripping step S5, the position shown in FIG. 9 is reached. The marker that has been formed and is "seen" by the measurement tool in measurement step S6 is formed by the optical contrast between regions A and B and which are defined by the edges E. The optical contrast may be provided by the fact that regions A, the regions where etching has occurred, have height variations whereas regions B do not. If the wavelength of the measurement beam is sufficiently larger than pitch P1, the pitch of the first pattern, the height variations in regions A will effectively be averaged out, so the sensor "sees" an average height, shown by a dotted line, in regions A that is lower than the height of regions B. Regions A and B will then form a diffraction grating to the radiation of the measurement beam with pitch P2 but exact position defined by the edges E.

Because the feature edges E are defined in a lithography step having a pitch P1 and/or CD, that is close to the pitch and/or CD of product features, in a particular embodiment the product features having smallest pitch or CD, the sensitivity of the marker edges to exposure or process parameters will be similar to the sensitivity of the product features. Hence, the marker position as measured by an appropriate sensor will be more representative of the actual position of product features.

Figure 10:
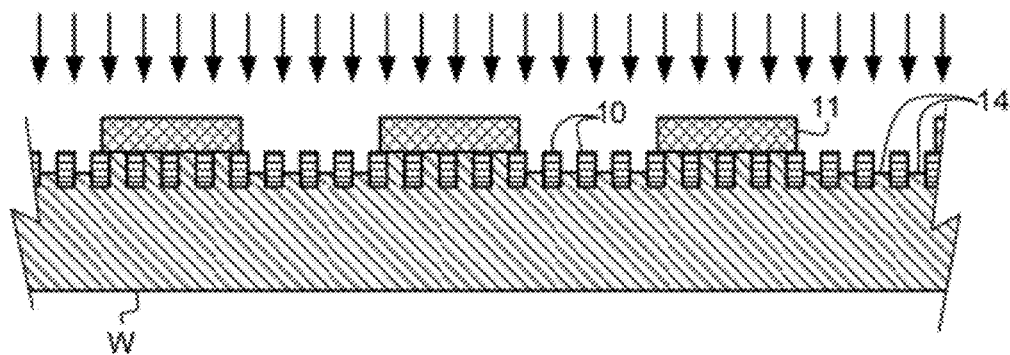
FIGS. 10 to 12 are views similar to FIGS. 7 to 9 respectively of a substrate undergoing a variant of the method of claim 2.
Figure 11:
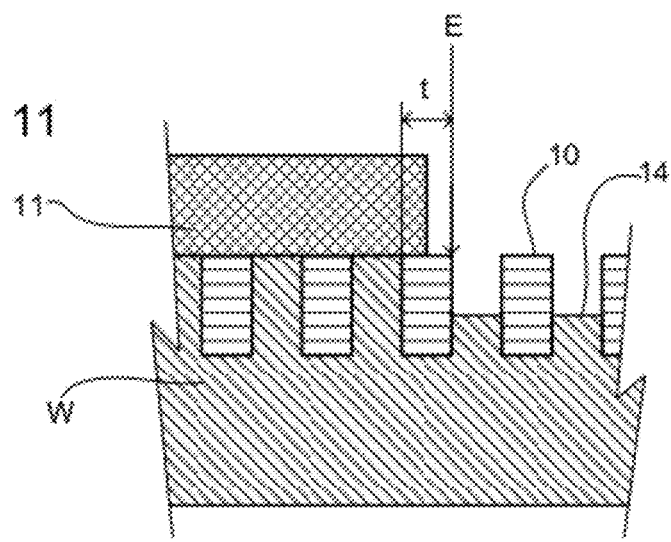
Figure 12:
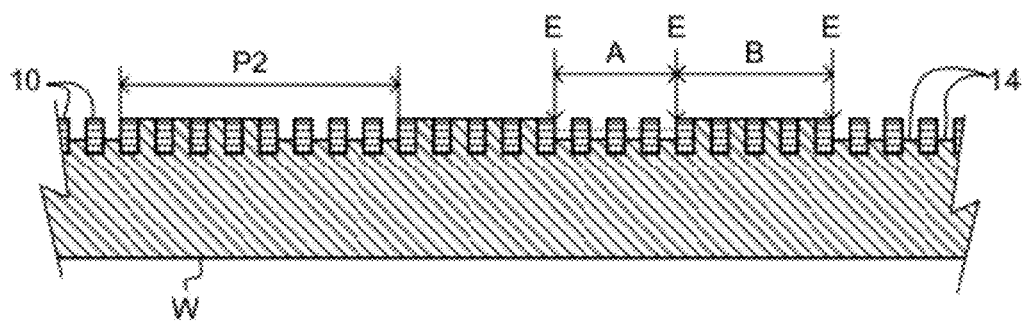

In a variant of the method of FIG. 2, an etchant that selectively etches the background regions 13 in preference to features 10 is used. The differences between this variant and the method described above, are shown in FIGS. 10 to 11, which correspond to FIGS. 7 to 9. Otherwise, the method of the variant may be the same as the method described above. As shown in FIGS. 10 and 11, in the variant, the features 11 of the second pattern are placed so that their edges lie on one of features 10, rather than one of the background features 13. Thus, the selective etch step reduces the heights of the background regions 13 to form sunken features 14 where the features 11 of the second pattern are not present. As shown in FIG. 12, the end result is again a marker defined by features having a pitch P2 but feature edges defined by the edges of the features 10 that are defined in an exposure with pitch P1. The marker position is therefore more representative of the actual position of product features.

Figure 13:
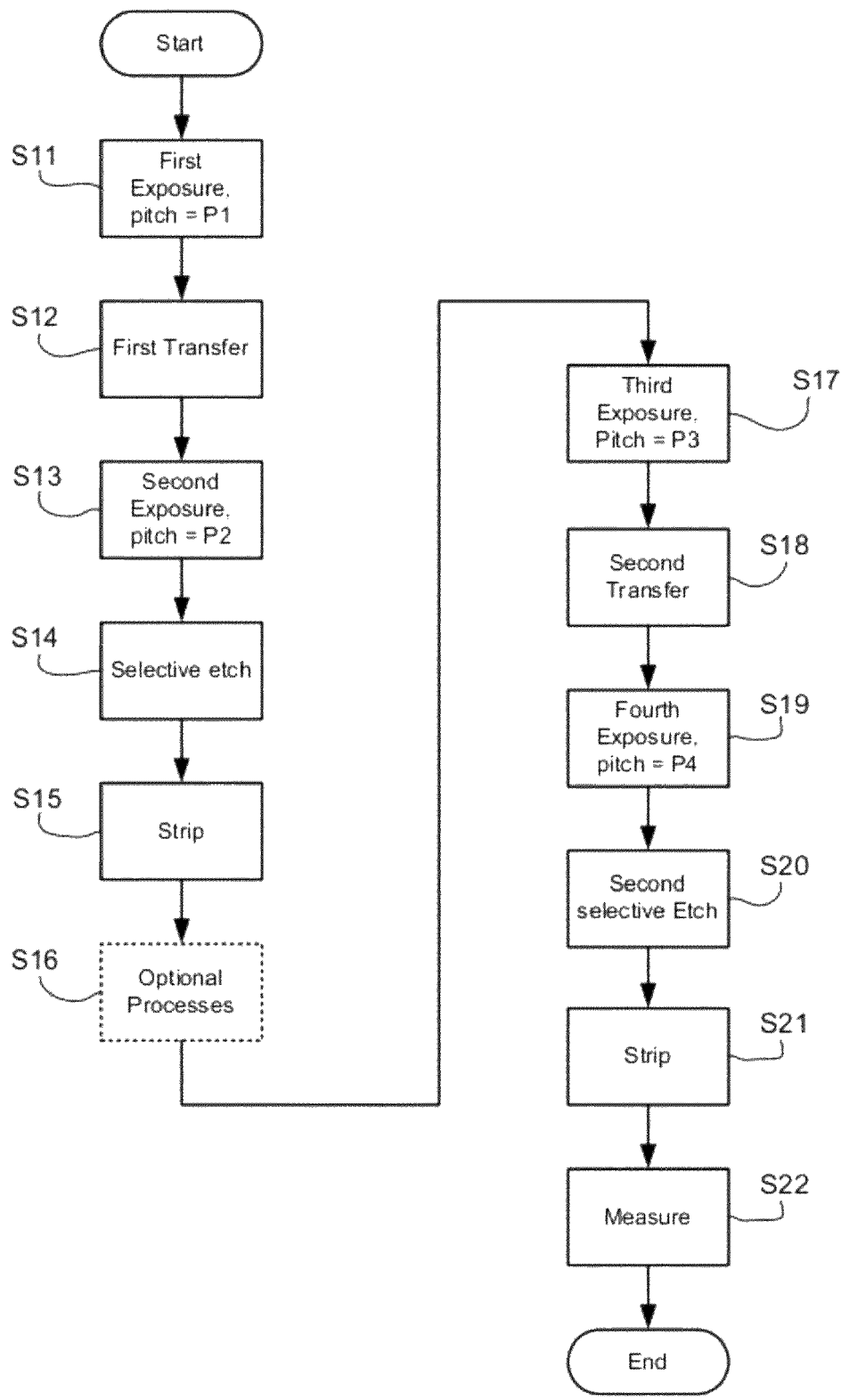
FIG. 13 is a flow diagram of a method of forming a marker according to another embodiment of the invention.

A method according to another embodiment of the invention is depicted in FIG. 13, which is a flow diagram of the method. This embodiment is modified to form an overlay marker having components in first and second layers of a product, the relative positions of which are to be measured. It involves steps that correspond to steps of the method above and are therefore not described again in detail.

In the method of FIG. 13, steps S11 to S15 correspond to steps S1 to S5 of the method of FIG. 2, except that the pattern formed in the second exposure step S13 differs. In this embodiment the second pattern is a first component of the overlay marker. For example, the second pattern may comprise: a box, to form part of a standard box-in-box marker; a chevron; a bar of a frame structure or a grating. The first exposure step is carried out as part of the exposure of the first product layer and forms a pattern with pitch P1 similar to the pitch of the product features in the first layer. The shape of the features of the first pattern may be modified for compatibility with the marker to be formed.

After the stripping step S15, optional steps S16 may be performed to create any layers between the first and second layers whose overlay is to be measured. If the first and second layers are consecutive, the optional processes may be omitted and the method proceeds to formation of the second component of the overlay marker. This is done by steps S17 to S21 which correspond to steps S1 to S5 of the method of FIG. 2. The third pattern formed in third exposure step S17 has pitch P3 which is similar to the product features in the second layer and is, in an embodiment, formed as part of the exposure of the second layer. Again, the exact form of the third pattern is determined for compatibility with the second component of the overlay marker. In an embodiment, P3 is equal to P1. The fourth pattern formed in fourth exposure step S19 corresponds to the second component of the overlay marker and may be, for example, a box or chevron.

After the fourth pattern has been stripped in step s21, the overlay between the first and second layers is measured using a suitable sensor, according to the form of the marker. Although the large scale shape of the overlay marker has been formed to meet the requirements of the overlay sensor, the actual edges of its features are defined in exposures having a pitch corresponding to the pitch of the relevant product features. Thus the measured overlay more accurately represents the overlay of the actual product features in the first and second layers.

Although the description above has concentrated on the application of the invention to alignment and overlay markers it will be appreciated that the invention is also applicable of other forms of marker.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of forming a marker on a substrate, the method comprising:
    exposing the substrate to define a first pattern in an area of the substrate, the first pattern having a pitch P1;
    transferring the first pattern into the substrate to form an array of alternating first and second features having a pitch P1;
    exposing the substrate to define a second pattern comprising third features over the array of alternating first and second features, the second pattern having a pitch P2, wherein P2 is greater than P1; and
    selectively chemically processing the substrate to alter one of the first and second features exposed by open areas of the second pattern in preference to the other of the first and second features.

2. The method of claim 1 wherein the transferring comprises selectively oxidizing parts of the substrate corresponding to the first features.

3. The method of claim 2 wherein the selectively chemically processing alters the first features in preference to the second features.

4. The method of claim 3. wherein edges of the third features overly second features.

5. The method of claim 2 wherein the selectively chemically processing alters the second features in preference to the first features.

6. The method of claim 5 wherein edges of the third features overly first features.

7. The method of claim 1, wherein P2 is substantially equal to an integer multiple of P1.

8. The method of claim 1, wherein P2 is greater than or equal to 4 times P1.

9. The method of claim 1 wherein the exposing the substrate to define a first pattern also exposes a plurality of product features having a minimum pitch and P1 is less than or equal to 150% of the minimum pitch.

10. The method of claim 9, wherein P1 is substantially equal to the minimum pitch.

11. The method of claim 1, wherein the third features correspond to the features of an alignment marker.

12. The method of claim 1, wherein the third features correspond to the features of a component of an overlay marker.

13. The method of claim 12 further comprising:
    exposing the substrate to define a third pattern in an area of the substrate, the third pattern having a pitch P3;

transferring the third pattern into the substrate to form an array of alternating fourth and fifth features having a pitch P3;
exposing the substrate to define a fourth pattern comprising sixth features over the array of alternating fourth and fifth features, the fourth pattern having a pitch P4, wherein P4 is greater than P3; and
selectively chemically processing the substrate to alter one of the fourth and fifth features exposed by open areas of the fourth pattern in preference to the other of the fourth and fifth features;
wherein the sixth features correspond to the features of a second component of an overlay marker.

14. A device manufacturing method comprising forming a marker on a substrate by the method according to claim 1, and measuring a property of the marker.

* * * * *